United States Patent
Chen et al.

(10) Patent No.: US 9,439,320 B2
(45) Date of Patent: Sep. 6, 2016

(54) TRAY

(71) Applicant: PEGATRON CORPORATION, Taipei (TW)

(72) Inventors: Ying-De Chen, Taipei (TW); Wei-Min Lou, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 14/803,774

(22) Filed: Jul. 20, 2015

(65) Prior Publication Data

US 2016/0128220 A1     May 5, 2016

(30) Foreign Application Priority Data

Nov. 4, 2014   (TW) .............................. 103138230 A

(51) Int. Cl.
| | | |
|---|---|---|
| *A47G 19/08* | (2006.01) | |
| *H05K 7/14* | (2006.01) | |
| *G06F 1/18* | (2006.01) | |
| *G11B 33/12* | (2006.01) | |

(52) U.S. Cl.
CPC ............... *H05K 7/1461* (2013.01); *G06F 1/18* (2013.01); *G11B 33/124* (2013.01)

(58) Field of Classification Search
CPC .. H05K 7/1422; H05K 7/1461; H05K 1/183; H05K 7/1435; H05K 7/1402
USPC ................ 211/40, 41.12, 41.17; 361/679.31, 361/679.32, 679.05
See application file for complete search history.

(56) References Cited

U.S. PATENT DOCUMENTS

| | | | |
|---|---|---|---|
| 7,033,222 B2 | 4/2006 | Kitamura | |
| 8,587,957 B2 * | 11/2013 | Shu ...................... | G11B 33/124 361/679.32 |
| 2005/0181674 A1 | 8/2005 | Kitamura | |
| 2008/0068813 A1* | 3/2008 | Rubenstein .......... | H05K 7/1461 361/752 |
| 2013/0250525 A1* | 9/2013 | Wang .................. | H05K 7/1461 361/737 |

FOREIGN PATENT DOCUMENTS

| | | |
|---|---|---|
| CN | 1667887 A | 9/2005 |
| CN | 2870213 Y | 2/2007 |

* cited by examiner

*Primary Examiner* — Brian Mattei
(74) *Attorney, Agent, or Firm* — McClure, Qualey & Rodack, LLP

(57) ABSTRACT

A tray for bearing different storage units includes a main body and a connecting rod. The main body includes a bottom plate, and the bottom plate has a bearing surface for bearing the storage units; the bottom plate is provided with an arc-shaped through hole. The arc-shaped through hole has a first end and a second end opposite to each other. The connecting rod is pivotally connected with the bottom plate, and one end of the connecting rod moves between the first end and the second end along the arc-shaped through hole. The tray further includes a supporting portion disposed on a side of the bottom plate opposite to the bearing surface and used for supporting the connecting rod.

9 Claims, 11 Drawing Sheets

TRAY

CROSS-REFERENCE TO RELATED APPLICATIONS

This Non-provisional application claims priority under 35 U.S.C. §119(a) on Patent Application No(s). 103138230 filed in Taiwan, Republic of China on Nov. 4, 2014, the entire contents of which are hereby incorporated by reference.

BACKGROUND

1. Technology Field

This disclosure relates to a tray and, more particularly, to a tray for bearing different storage units.

2. Description of the Related Art

Storage units such as hard disks, hard disk cards, memory cards, and PCB modules are commonly born by trays. Accordingly, the storage units can be loaded at apparatus or systems via carriers. Generally speaking, different carriers have to be provided according to different types and specifications of the storage units. In other words, one specific carrier commonly applies to only one storage unit of a specific specification or in a specific type.

SUMMARY

One objective of the disclosure is to provide a tray for bearing different storage units.

Another objective of the disclosure is to provide a tray to obtain different structures via simplified components.

According to one aspect of the disclosure, the disclosure provides a tray for bearing storage units in different size. The tray includes a main body, an arc-shaped through hole, a connecting rod, and a supporting portion. The main body includes a bottom plate, and the bottom plate has a bearing surface for bearing the storage units. The arc-shaped through hole is formed at the bottom plate and has a first end and a second end opposite to each other. One end of the connecting rod is pivotally connected with the bottom plate, and the other end of the connecting rod moves between the first end and the second end along the arc-shaped through hole. The supporting portion is disposed on one side of the bottom plate opposite to the bearing surface and adjacent to the arc-shaped through hole and is used for supporting the connecting rod at a specific location.

In one embodiment, the arc-shaped through hole may be formed at the bottom plate along the circumference of a virtual circle. In one embodiment, a pivot center of the connecting rod may be at the bottom plate, and the center of the virtual circle may be at the pivot center.

In one embodiment, the connecting rod may be disposed on the side of the bottom plate opposite to the bearing surface.

In one embodiment, the supporting portion may be disposed at at least one of the first end and the second end and may have a bottom portion for supporting the connecting rod. In one embodiment, the supporting portion may further have a side wall extending from the bottom plate to connect with the bottom portion and have an L-shaped section.

In one embodiment, the connecting rod may include a sheet body, and the bottom portion of the supporting portion may be parallel to the bottom plate and may support the sheet body.

In one embodiment, the connecting rod may include a limiting element, and the limiting element may pass through the arc-shaped through hole to protrude from the bearing surface.

In one embodiment, the main body may have at least one protrusion at the arc-shaped through hole, and the connecting rod may include a limiting element interfering with the protrusion. In one embodiment, the protrusion may be formed at the edge of the arc-shaped through hole, and the limiting element may extend through the arc-shaped through hole towards the bearing surface.

In one embodiment, the at least one protrusion may be disposed at at least one of the first end and the second end to limit the limiting element to the first end or the second end. In one embodiment, the main body may further include a sidewall along which the storage unit is disposed at the bottom plate, and the line between two locations of the first end and the second end at which the limiting element are located, may be parallel to the sidewall.

These and other features, aspects, and advantages of the present invention will become better understood with regard to the following description, appended claims, and accompanying drawings.

DETAILED DESCRIPTION

The disclosure provides a tray for bearing storage units in different size or of different specifications. For example, the storage units may be hard disk cards such as M2 cards of different specifications. The storage units may be hard disks including different interfaces such as SATA, SCSI, SAS, ATA and/or having different specifications such as 3.5 inch, 2.5 inch and so on. The storage units may include PCB modules. The tray can be used as an extracting cartridge, a protecting cartridge, or a bracket of a hard disk, or the tray can be used as a part of the extracting cartridge, the protecting cartridge, or the bracket.

Figure 1A:
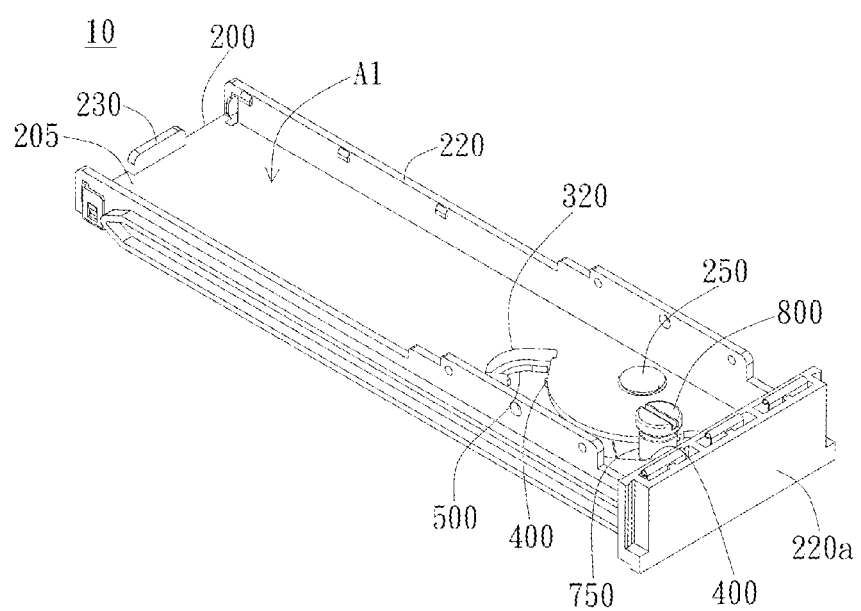
FIG. 1A is a three-dimensional diagram of a tray according to one embodiment of the disclosure.
Figure 1B:
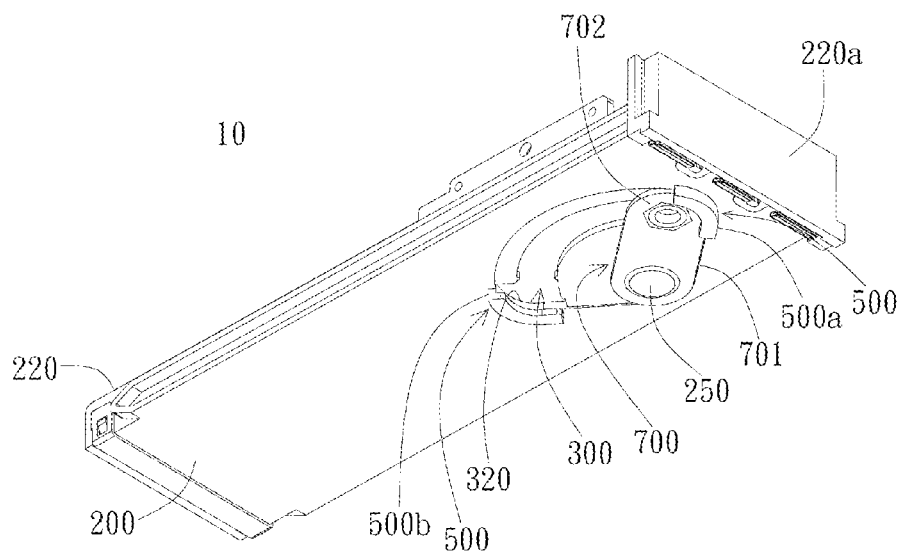
FIG. 1B is a three-dimensional diagram of the tray from another perspective according to one embodiment of the disclosure.
Figure 2:
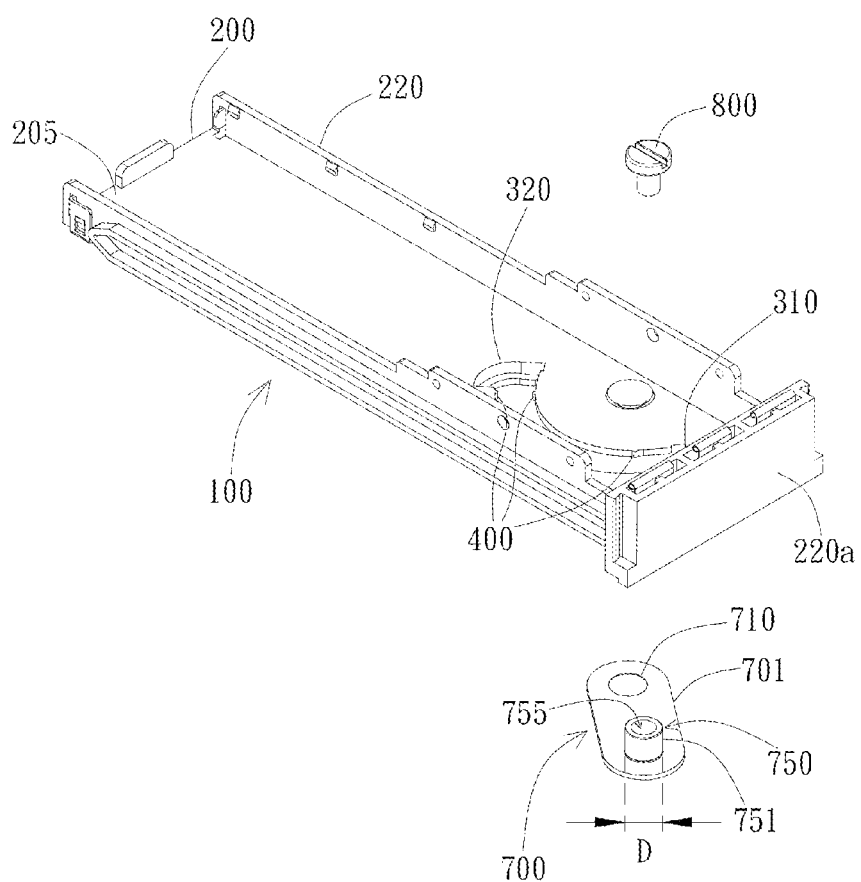
FIG. 2 is an exploded diagram of the tray in FIG. 1A.

In FIG. 1A, FIG. 1B, and FIG. 2, a tray 10 in this embodiment includes a main body 100 and a connecting rod 700. The main body 100 includes a bottom plate 200, and the bottom plate 200 has a bearing surface 205 for bearing a storage unit. The bearing surface 205 may not be a surface of the bottom plate 200 and may not be limited to a complete and continuous surface, either. The plane where the storage unit is disposed at the main body 100 means the bearing surface 205. Fox example, the bearing surface 205 in FIG. 1A and FIG. 1B is on a complete and continuous surface of the bottom plate 200. However, the disclosure is not limited thereto. In other embodiments, the storage unit is partly exposed to the bottom plate 200 while being born by the bearing surface 205. In addition, preferably, the main body 100 further includes a sidewall 220 or forms a limiting structure such as a baffle 230 or a convex column on the side of the bottom plate 200 having the bearing surface 205 to limit the relative location between the born storage unit and the bottom plate 200.

In a preferred embodiment, the main body 100 is roughly rectangle and has the rectangle bottom plate 200 with two opposite long side edges and two opposite short side edges. The shape of the rectangle main body 100 corresponds to that of the storage unit. The sidewall 220 can be continuously formed on the side edges of the rectangle bottom plate 200 or can be discontinuously distributed or distributed with variable length on the side edges. In one embodiment, the short side edges of the main body 100 correspond to the front end and the back end of the main body 100, respectively. For example, the front sidewall 220a can form a structure convenient for a user to pull and push the tray 10 from the front end of the main body 100. In addition, the main body 100 in the disclosure applies to one type of storage unit. This type of storage unit is preferably rectangle, and the length of the side edge (the short side edge or the long side edge) is substantially equal to the distance between the two opposite long side edges of the main body 100. When this type of storage unit is placed at the main body 100, the storage unit can abut on the two opposite long side edges with the opposite side edges, respectively. The opposite side edges of the storage unit are commonly long side edges.

Figure 3A:
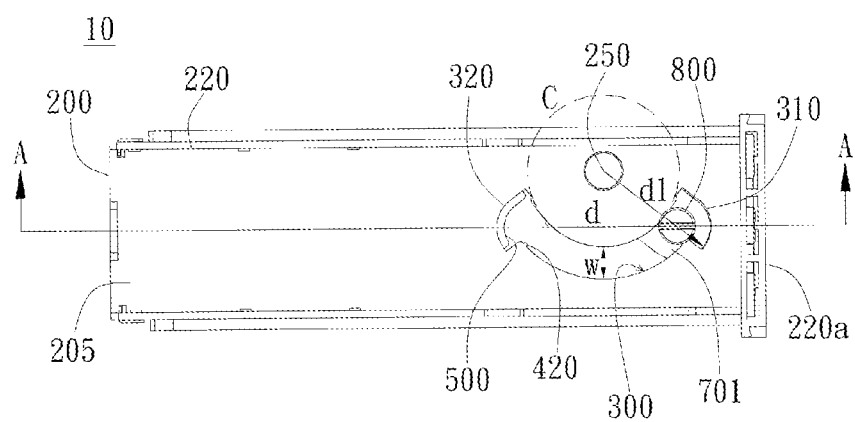
FIG. 3A and FIG. 3B are a top view and a bottom view of the tray in FIG. 1A, respectively.

In FIG. 1A, FIG. 1B, and FIG. 3A, the bottom plate 200 of the main body 100 has an arc-shaped through hole 300; the arc-shaped through hole 300 has a first end 310 and a second end 320 opposite to each other. The connecting rod 700 is pivotally connected with the bottom plate 200. As the connecting rod 700 rotates, one end of the connecting rod 700 can move along the arc-shaped through hole 300 or roughly in parallel with the arc-shaped through hole 300, and preferably, can move between the first end 310 and the second end 320 back and forth. In addition, the connecting rod 700 includes a limiting element 750, and the limiting element 750 passes through the arc-shaped through hole 300 to protrude from the bearing surface 205. Preferably, the limiting element 750 can move along the arc-shaped through hole 300 along with the rotation of the connecting rod 700 and protrude from different locations of the bearing surface 205. The limiting element 750 can limit the relative location between the storage unit and the bottom plate 200. In addition, the limiting element 750 can limit the relative location between the storage unit and the bottom plate 200 together with the aforementioned limiting structure such as the sidewall 200, or the baffle 230, or the convex column.

Figure 3B:
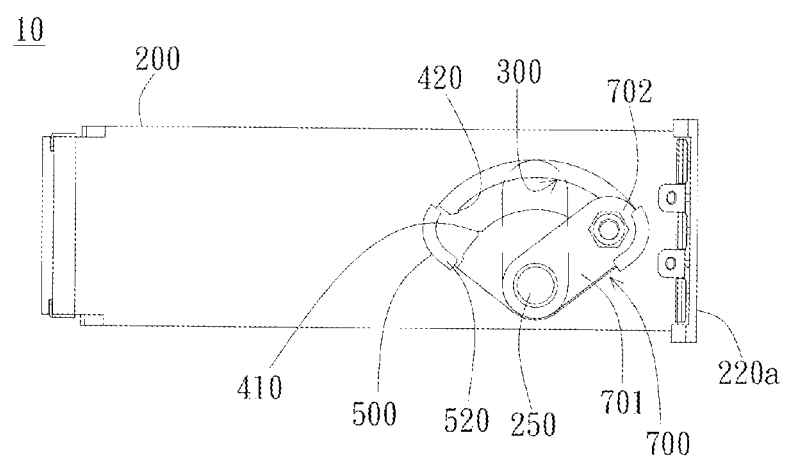

In one embodiment, the limiting element 750 is close to or far away from the front end/back end of the main body 100 as the limiting element 750 changes the location in the arc-shaped through hole 300. For example, the limiting element 750 changes the location relative to the front end/back end along with the location change between the first end 310 and the second end 320 of the arc-shaped through hole 300. In FIG. 3A and FIG. 3B, the distance between the first end 310 and the back end of the main body 100 is greater than that between the second end 320 and the back end, and the limiting element 750 can form areas in different size with the sidewall 220 or other limiting structure surrounding the main body 100 at the first end 310 and the second end 320, respectively. When the aforementioned storage unit is placed at the main body 100, the two opposite long side edges of the storage unit can abut on the two opposite long side edges of the main body 100, respectively, and can be limited at the bearing surface 205 via the limiting element 750 and the limiting structure disposed at the front end or back end of the main body 100.

Further, in FIG. 3A, the arc-shaped through hole 300 is formed at the bottom plate 200 along the circumference of a virtual circle C. The virtual circle C is parallel with the bottom plate 200, and at least part of the projections of the circumference are at the bottom plate 200. In addition, the arc-shaped through hole 300 has a width W in a radial direction d of the virtual circle C. On the other hand, a pivot center of the connecting rod 700 is at the bottom plate 200. For example, a hinge is disposed at the bottom plate 200 to be used as the pivot center. The pivot center can overlap the projection of the center of the virtual circle C at the bottom plate 200, namely, the center of the virtual circle C is at the pivot center.

In a preferred embodiment of the disclosure, the connecting rod 700 is disposed on the side of the bottom plate 200 opposite to the bearing surface 205. In other words, the connecting rod 700 of the tray 10 protrudes from the bottom of the main body 100. In FIG. 2, the connecting rod 700 can include a sheet body 701, and the sheet body 701 is parallel with the bottom plate 200 and is disposed at one side of the bottom plate 200 opposite to the bearing surface 205. In addition, the connecting rod 700 can be pivotally connected with bottom plate 200 in an extending direction of the sheet body 701. Accordingly, the sheet body 701 occupies small space at the main body 100.

The connecting rod 700 is pivotally connected with the bottom plate 200 by one end of the sheet body 701, and the other end moves along the arc-shaped through hole 300 with the rotation of the connecting rod 700. One end of the sheet body 701 has an axle hole 710 thus to be disposed at the pivot center of the bottom plate 200 via the aforementioned hinge. In FIG. 3A and FIG. 3B, as one end of the connecting rod 700 moves along the arc-shaped through hole 300, the sheet body 701 can sequentially cover part of the arc-shaped through hole 300 on the side of the bottom plate 200 opposite to the bearing surface 205. On the side where the bearing surface 205 is disposed, the sheet body 701 is partly exposed to the arc-shaped through hole 300. Preferably, the sheet body 701 covers the arc-shaped through hole 300 and further extends in a radial direction of the virtual circle C to exceed the arc-shaped through hole 300 (it may be described in detail below).

In addition, the connecting rod 700 includes a limiting element 750. The limiting element 750 includes a column 751. As previously described, the connecting rod 700 is pivotally connected with the bottom plate 200 by one end of the sheet body 701, and the other end of moves along the arc-shaped through hole 300 with the rotation of the connecting rod 700. In detail, the limiting element 750 is disposed at the end of the connecting rod 700 moving along the arc-shaped through hole 300 and on the side of the sheet body 701 facing the bottom plate 200, especially at the portion of the sheet body 701 exposed to the arc-shaped through hole 300. The height direction of the column 751 is preferably vertical to the bottom plate 200. The height of the column 751 is no less than the thickness of the bottom plate 200, preferably, greater than the thickness of the bottom plate 200. The width/radius D of the column 751 is not more than the width W of the arc-shaped through hole 300. For example, the column 751 is a riveted element. In a preferred embodiment of the disclosure, one end of the limiting element 750 opposite to the sheet body 701 can be provide with a locking hole 755 for receiving a locking element 800. In a preferred embodiment, the line between two locations of the first end 310 and the second end 320 at which the limiting element 750 located is parallel to the sidewall 220.

In FIG. 2 and FIG. 3A, in the embodiment, the bottom plate 200 of the main body 100 is further provided with at least one protrusion 400 at the borders of the arc-shaped through hole 300. In detail, the protrusion 400 is formed at the edge of the arc-shaped through hole 300. When the arc-shaped through hole 300 is formed, a portion of the bottom plate 200 in suitable size can be kept to form the protrusion 400. In addition, the protrusion 400 can interfere with the limiting element 750.

Further, the protrusion 400 interferes with the limiting element 750 to limit the location of the limiting element 750 in the arc-shaped through hole 300. In detail, the limiting element 750 can commonly move smoothly in the arc-shaped through hole 300 on the both sides of the protrusion 400. When the limiting element 750 is to pass the protrusion 400, a resistive force has to be overcome by extra power to pass the protrusion 400. The protrusion 400 is preferably disposed adjacent to the first end 310 and/or the second end 320 of the arc-shaped through hole 300. That is, the arc-shaped through hole 300 adjacent to both the first end 310 and the second end 320 is provided with the protrusions 400, or the arc-shaped through hole 300 only adjacent to the first end 310 or the second end 320 is provided with the protrusion 400. When the limiting element 750 moves towards the first end 310 or the second end 320, it firstly passes the protrusion 400. After the resistive force from the protrusion 400 is overcome, the limiting element 750 can be positioned at the first end 310 or the second end 320. Conversely, when the limiting element 750 is to leave the first end 310 or the second end 320, preferably it needs to pass the protrusion 400. After the resistive force from the protrusion 400 is overcome, the limiting element 750 can leave the first end 310 or the second end 320. Accordingly, the protrusion 400 can limit the limiting element 750 to the first end 310 or the second end 320. Further, the connecting rod 700 connected with the limiting element 750 stops in the radial direction d1 of the virtual circle C as shown in FIG. 3A. In the embodiment, for example, the width/radius D of the column 751 of the limiting element 750 is no less than the distance between the protrusion 400 and the opposite hole edge. The protrusion 400 and the hole edge are in the same radial direction of the virtual circle C. It should be noted that the limiting element 750 at the first end 310 or the second end 320 is not limited to abutting on the edge of the arc-shaped through hole 300.

In FIG. 3A and FIG. 3B, in a preferred embodiment, the edge of the arc-shaped through hole 300 adjacent to the first end 310 and/or the second end 320 of the arc-shaped through hole 300 forms a first protrusion 410 and a second protrusion 420 opposite to each other. The first protrusion 410 and the second protrusion 420 can be in the same radial direction of the virtual circle C, while it is not limited thereto. For example, compared to the second protrusion 420, the first protrusion 410 is closer to the center of the virtual circle C. On the other hand, the vertical distance between the first protrusion 410 and the second protrusion 420 is not more than the width/radius of the column 751 of the limiting element 750. When the limiting element 750 moves towards the first end 310 or the second end 320, it firstly passes the first protrusion 410 and the second protrusion 420 and overcomes the resistive forces therefrom thus to reach the first end 310 or the second end 320. Conversely, when the limiting element 750 is to leave the first end 310 or the second end 320, it firstly passes the first protrusion 410 and the second protrusion 420 and overcomes the resistive forces therefrom thus to leave the first end 310 or the second end 320.

On the other hand, the connecting rod 700 in the embodiment moves back and forth between the first end 310 and the second end 320 of the arc-shaped through hole 300, namely, the limiting element 750 moves back and forth between the first end 310 and the second end 320. In addition, the sheet body 701 connected with the limiting element 750 extends away from the limiting element 750 and further away from the pivot center to exceed the arc-shaped through hole 300. The portion of the sheet body 701 extending away from the limiting element 750 can be called flange 702 as shown in FIG. 3B. The flange 702 preferably includes the portions of the sheet body 701 covering the arc-shaped through hole 300 and exceeding the arc-shaped through hole 300 in the radial direction of the virtual circle C.

In FIG. 1B and FIGS. 3A to 3C, the tray in the embodiment of the disclosure further includes a supporting portion 500 for supporting the connecting rod 700 at a specific location. The supporting portion 500 is preferably disposed on one side of the bottom plate 200 opposite to the bearing surface 205 and on the outside of the arc-shaped through hole 300. In addition, the supporting portion 500 can support the connecting rod 700 when the connecting rod 700 stops.

The supporting portion 500 further has a bottom portion 520. The bottom portion 520 is disposed separating from the bottom plate 200 and supports the connecting rod 700 protruding from the bottom plate 200. In the embodiment including the connecting rod 700 having the sheet body 701, the bottom portion 520 can be formed in parallel with the bottom plate 200. Preferably, the supporting portion 500 is disposed at the outside of the first end 310 and/or the second end 320 of the arc-shaped through hole 300. That is, the outsides of both the first end 310 and the second end 320 of the arc-shaped through hole 300 are provided with the supporting portions 500, or the outside of only the first end 310 or the second end 320 is provided with the supporting portion 500. When the connecting rod 700 rotates and moves to the first end 310 or the second end 320 along the arc-shaped through hole 300, the connecting rod 700 can be supported at the first end 310 or the second end 320 by the supporting portion 500. In a preferred embodiment, the connecting rod 700 moves along the arc-shaped through hole 300 and commonly stops at the first end 310 or the second end 320. The supporting portion 500 supports the connecting rod 700 when one end of the connecting rod 700 moving along the arc-shaped through hole 300 stops at the first end 310 or the second end 320. In other embodiments, the supporting portion 500 can be disposed along the arc-shaped through hole 300, namely the arc of the virtual circle C, thus continuously supporting the connecting rod 700.

Figure 3C:
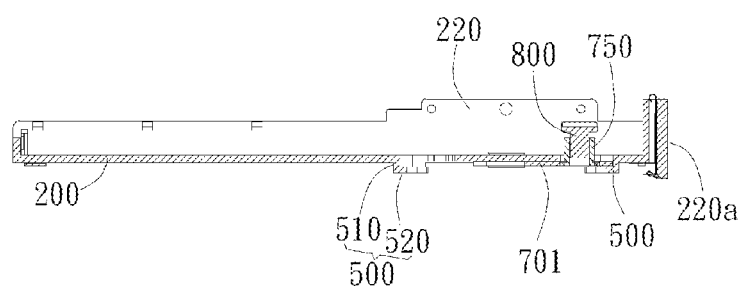
FIG. 3C is a cross-section diagram along an AA line in FIG. 3A.

The supporting portion 500 preferably supports the flange 702 of the sheet body 701 of the connecting rod 700. On the other hand, the supporting portion 500 further includes a side wall 510 extending from the bottom plate 200 and connected with the bottom portion 520. In FIG. 3C, the supporting portion 500 includes the side wall 510 and the bottom portion 520 and has an L-shaped section. In addition, the shape of the supporting portion 500 corresponds to that of the flange 702. For example, two ends of the sheet body 701 are arc-shaped, and the edge of the flange 702 is arc-shaped. The supporting portion 500 is arc-shaped, and the flange 702 can be contained in the L-shaped space and be supported by the bottom portion 520.

Figure 4A:
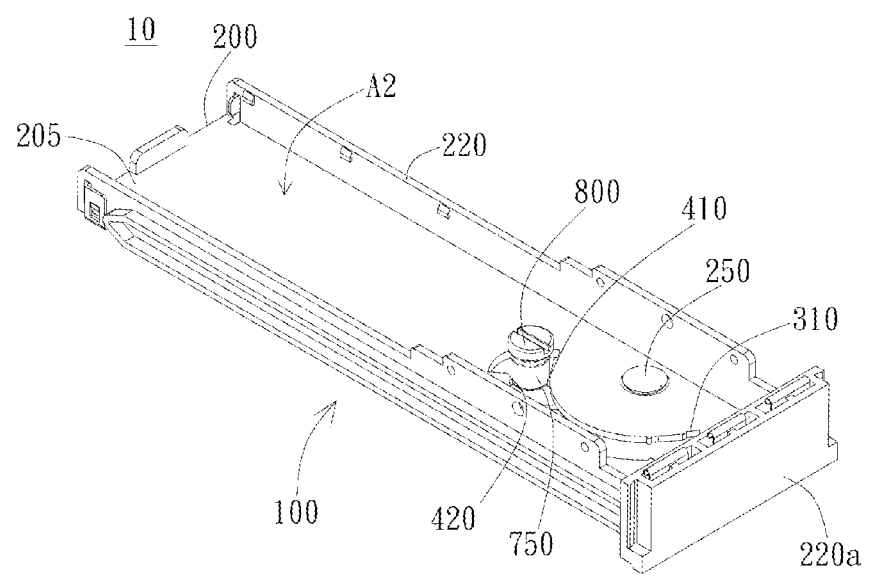
FIG. 4A is a three-dimensional diagram of the tray in another state according to one embodiment of the disclosure.
Figure 4B:
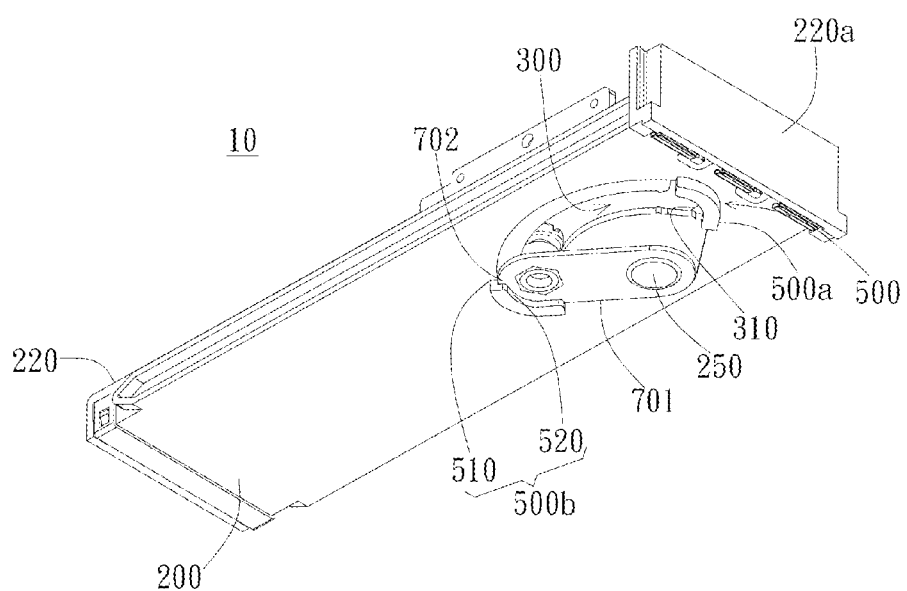
FIG. 4B is a three-dimensional diagram of the tray in FIG. 4A from another perspective.

The action of the tray 10 in the embodiment of the disclosure may be described below referring to the FIG. 4A and FIG. 4B. Please refer to FIG. 1A and FIG. 1B firstly. One end of the connecting rod 700 is at the first end 310 of the arc-shaped through hole 300, and the limiting element 750 thereof is at the first end 310. At this time, the supporting portion 500a disposed at the outside of the first end 310 supports the flange 702 of the connecting rod 700. On the other hand, the connecting rod 700 can further limit the limiting element 750 to the first end 310 via the protrusion 400, thus keeping the connecting rod 700 swinging to the front end of the main body 100.

In FIG. 3A and FIG. 3B, the connecting rod 700 can pivot from the first end 310 to the second end 320. In a preferred embodiment, after the limiting element 750 overcomes the resistive force from the protrusion 400, the connecting rod 700 leaves the first end 310 to rotate towards the second end 320. On the other hand, after the limiting element 750 overcomes the resistive force from the other protrusion 400, the connecting rod 700 rotates to and locates at the second end 320. In FIG. 4A and FIG. 4B, the supporting portion 500b at the outside of the second end 320 supports the flange 702 of the connecting rod 700. Accordingly, the limiting element 750 protrudes from the different locations of the bearing surface 205 as the connecting rod 700 rotates, thus forming areas in different size with the sidewall 220 or other limiting structure of the main body 100.

Figure 5:
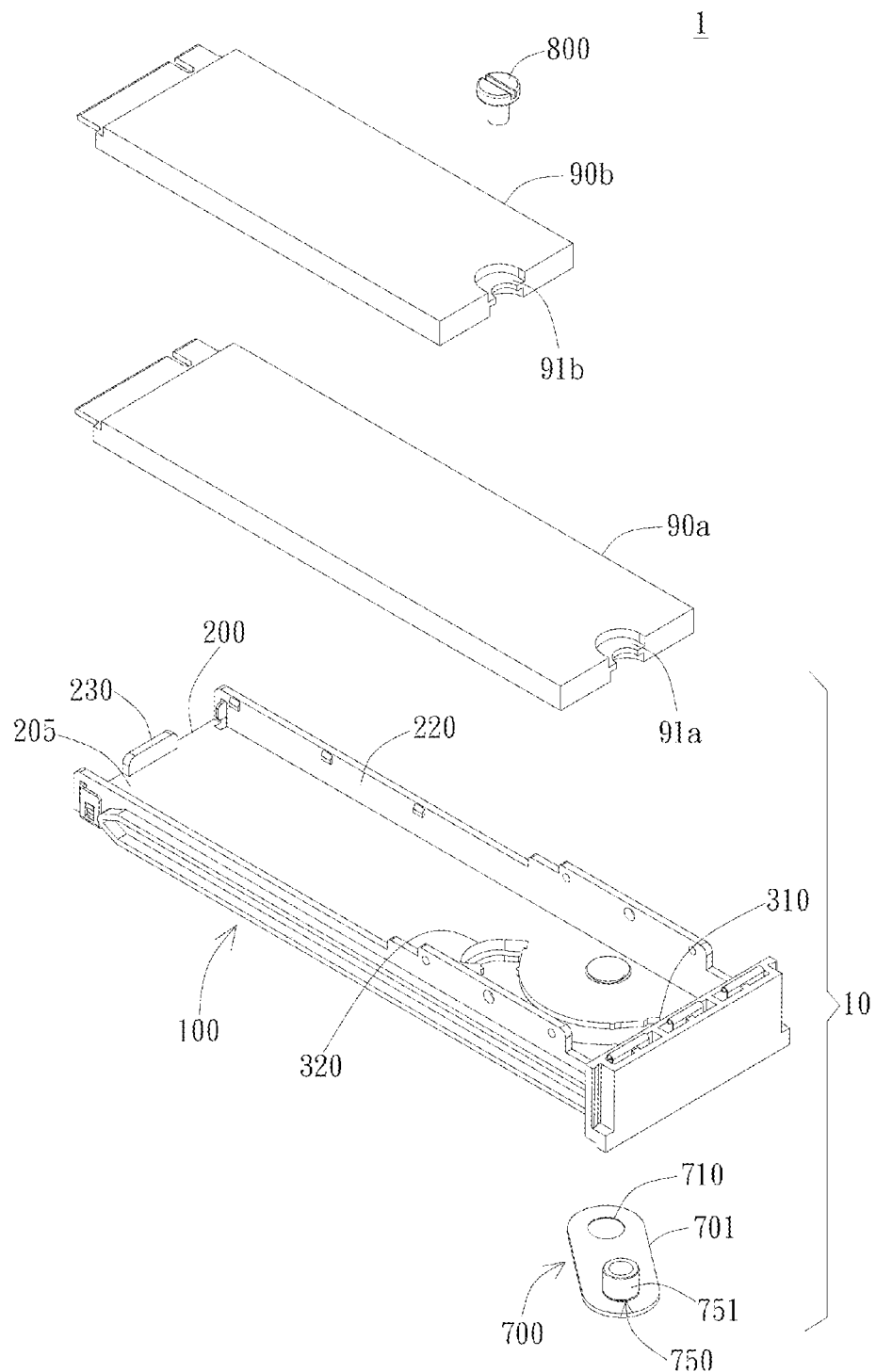
FIG. 5 is an exploded diagram of a storage device according to one embodiment of the disclosure.

FIG. 5 is an exploded diagram of a storage device according to one embodiment of the disclosure. The tray in the disclosure can bear different storage units. In the storage device 1 in FIG. 5, the tray 10 can bear at least two storage units 90a, 90b. The storage units 90a, 90b are preferably rectangle, and the length of the short side edge is substantially equal to the distance between the two opposite long side edges of the main body 100. When the storage unit is placed at the main body 100, the two opposite long side edges of the storage unit 90a/90b can abut on the sidewalls 220 at the two opposite long side edges of the main body 100, respectively.

Figure 6A:
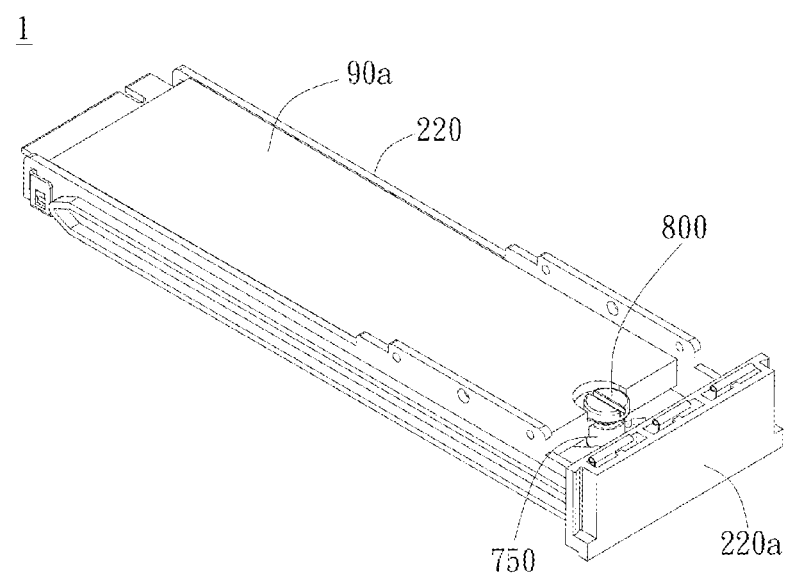
FIG. 6A and FIG. 6B are schematic diagrams of the storage device in use according to one embodiment of the disclosure.
Figure 6B:
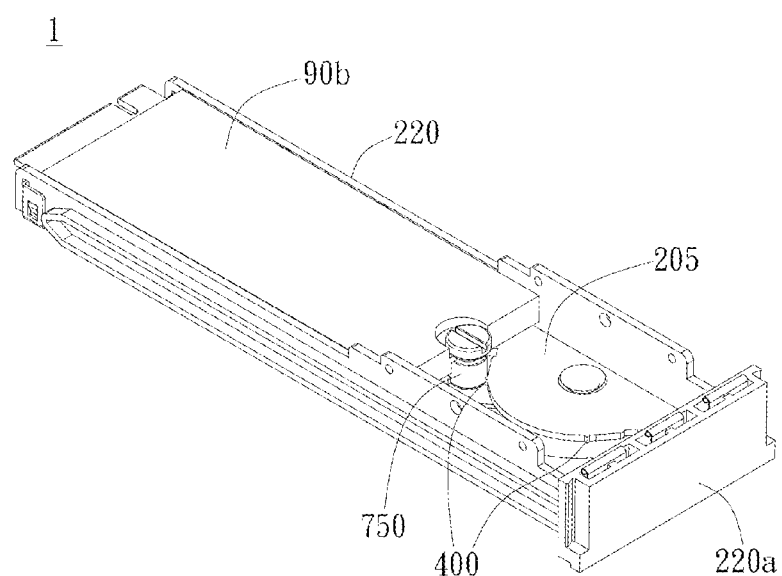

On the other hand, as described above, the limiting element 750 protrudes from the different locations of the bearing surface 205 as the connecting rod 700 rotates, thus forming the areas in different size with the sidewall 220 or other limiting structure of the main body 100. FIG. 6A and FIG. 6B are schematic diagrams of the storage device 1 in use according to one embodiment of the disclosure. In FIG. 6A, when the limiting element 750 is at the first end 310, the limiting element 750 and other limiting structure of the main body 100 form an area A1 for fully containing the storage unit 90a, and the short side edges of the storage unit 90a abuts on the limiting element 750. In FIG. 6B, when the limiting element 750 is at the second end 320, the limiting element 750 and other limiting structure of the main body 100 form an area A2 for fully containing the storage unit 90b, and the short side edges of the storage unit 90b abuts on the limiting element 750.

The storage units 90a, 90b can further have limiting portions 91a, 91b. The limiting portions 91a, 91b can abut on the limiting element 750. On the other hand, the locking element 800 can be locked in the locking hole 755 and clamp the limiting portion 91a or 91b together with the limiting element 750. In one embodiment, the tray 10 locks the storage unit 90a/90b at the main body 100 via the limiting element 750 of the connecting rod 700 and the locking element 800.

The single tray in the disclosure can bear at least two types of storage units and limit the storage units to the specific location of the bearing surface via the main body, the arc-shaped through hole formed at the bottom plate of the main body, the connecting rod capable of moving along the arc-shaped through hole, and the limiting element of the connecting rod protruding from the bottom portion through the arc-shaped through hole. In other words, the tray can fasten the storage unit. Further, since the connecting rod is pivotally connected with the bottom plate, the tray can be adjusted without disassembly.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A tray for bearing storage units in different size, comprising:
   a main body including a bottom plate and at least one protrusion, wherein the bottom plate has a bearing surface for bearing the storage units;
   an arc-shaped through hole formed at the bottom plate, wherein the arc-shaped through hole has a first end and a second end opposite to each other, the arc-shaped through hole is formed at the bottom plate along a circumference of a virtual circle, the at least one protrusion is at the arc-shaped through hole;
   a connecting rod, wherein one end of the connecting rod is pivotally connected with the bottom plate, and the other end of the connecting rod moves between the first end and the second end along the arc-shaped through hole, a pivot center of the connecting rod is at the bottom plate, and a center of the virtual circle is at the pivot center; wherein the connecting rod comprises a limiting element interfering with the protrusion; and
   a supporting portion disposed on a side of the bottom plate opposite to the bearing surface and adjacent to the arc-shaped through hole, the supporting portion used for supporting the connecting rod at a specific location.

2. The tray according to claim 1, wherein the connecting rod is disposed on the side of the bottom plate opposite to the bearing surface.

3. The tray according to claim 1, wherein the supporting portion is disposed at at least one of the first end and the second end, and the supporting portion has a bottom portion for supporting the connecting rod.

4. The tray according to claim 3, wherein the supporting portion further has a side wall extending from the bottom plate to connect with the bottom portion and has an L-shaped section.

5. The tray according to claim 3, wherein the connecting rod comprises a sheet body, and the bottom portion of the supporting portion is parallel to the bottom plate and supports the sheet body.

6. The tray according to claim 1, wherein the connecting rod comprises a limiting element, and the limiting element passes through the arc-shaped through hole to protrude from the bearing surface.

7. The tray according to claim 1, wherein the protrusion is formed at the edge of the arc-shaped through hole, and the limiting element extends through the arc-shaped through hole towards the bearing surface.

8. The tray according to claim 1, wherein the at least one protrusion is disposed at at least one of the first end and the second end to limit the limiting element to the first end or the second end.

9. The tray according to claim 8, wherein the main body further comprises a sidewall along which the storage unit is disposed at the bottom plate, and a line between two locations of the first end and the second end at which the limiting element are located is parallel to the sidewall.

* * * * *